(12) United States Patent
Brandenburg et al.

(10) Patent No.: US 6,593,527 B1
(45) Date of Patent: Jul. 15, 2003

(54) INTEGRATED CIRCUIT ASSEMBLY WITH BAR BOND ATTACHMENT

(75) Inventors: Scott D. Brandenburg, Kokomo, IN (US); Robert Vajagich, South Milwaukee, WI (US); Gary E. Oberlin, Windfall, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/124,782

(22) Filed: Apr. 17, 2002

(51) Int. Cl.$^7$ .................... H02G 3/08; H01L 23/495
(52) U.S. Cl. .................... 174/52.1; 174/52.4; 257/669; 257/674
(58) Field of Search .................... 174/52.1, 52.2, 174/52.4; 257/669, 674

(56) References Cited

U.S. PATENT DOCUMENTS 6,083,772 A * 7/2000 Bowman et al. ............ 438/106

* cited by examiner

Primary Examiner—Hung V. Ngo
(74) Attorney, Agent, or Firm—Jimmy L. Funke

(57) ABSTRACT

An integrated circuit assembly 10 is provided, including a substrate 14 having at least one substrate contact surface 18, an integrated circuit device 12 having at least one first contact surface 16, and a bar bond element 22. The bar bond element 22 provides communication between the at least one substrate contact surface 18 and the at least one first contact surface 16. The bar bond element 22 includes a conductive plate element 23 having an integrated circuit foot portion 24, a substrate foot portion 26 and a strain relief loop 46 positioned between the integrated circuit foot portion 24 and the substrate foot portion 26.

19 Claims, 1 Drawing Sheet

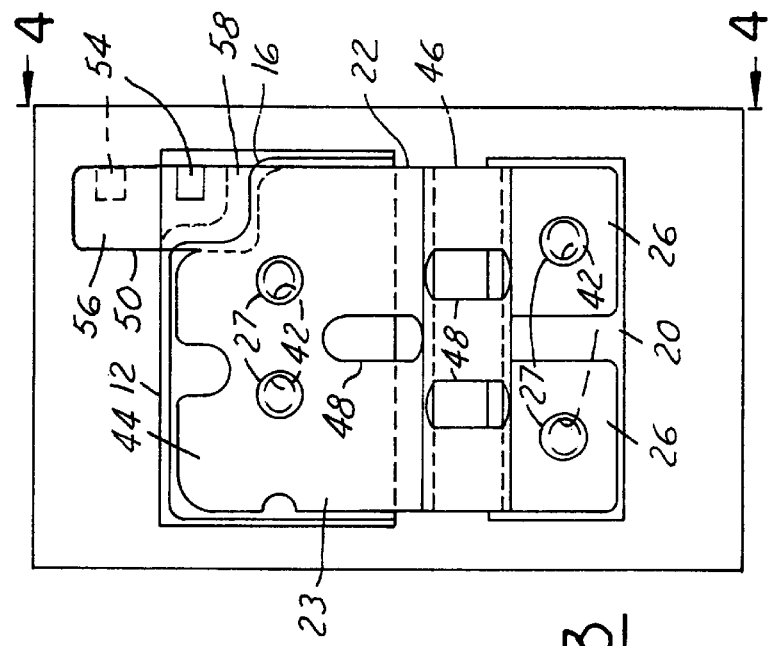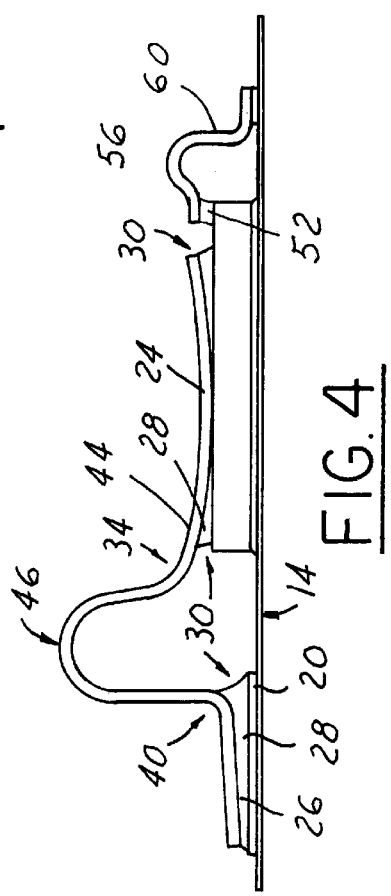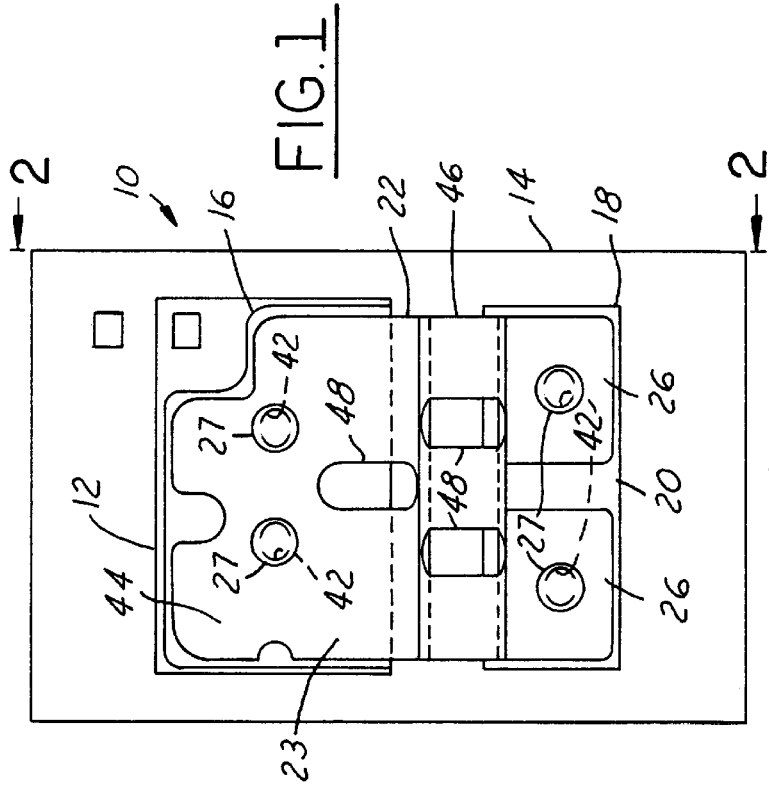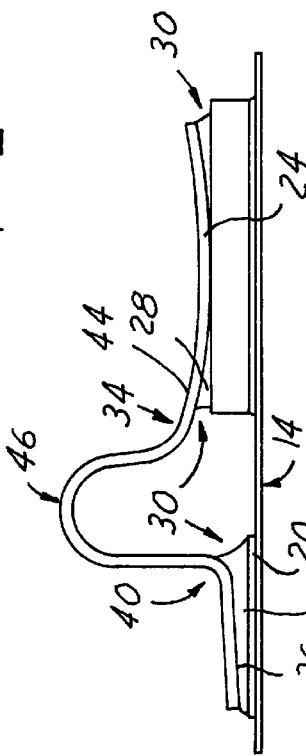

INTEGRATED CIRCUIT ASSEMBLY WITH BAR BOND ATTACHMENT

TECHNICAL FIELD

The present invention relates generally to an integrated circuit assembly with a bar bond connector. More specifically, the present invention relates to an integrated circuit assembly with a bar bond connector and improved soldered connections.

BACKGROUND OF THE INVENTION

The present invention relates to a method and apparatus for electrically connecting an integrated circuit device, particularly a power transistor to a substrate. Field effect transistor (FET) devices are typically configured and packaged in arrangements (such as TO-220 or D-Pak type IC packages) in which the integrated circuit (IC) is mounted to a copper slug, wirebonded, and overmolded. The packaged assembly is then commonly mounted to a substrate by either thru hole or surface mount soldering processes. Although these "packaged" IC devices have been widely known and utilized, it is also known that they can result in increased circuit board area and product costs. Trends for decreased circuit board area and reduced product costs within the electronics industry have therefore created a move to "depackage" these devices. "Depackaging" these devices commonly consists of mounting the bare chip directly to the substrate. Although mounting the bare chip directly to the substrate can assist in the reduction of circuit board area and product costs, present methods of attaching the active circuit side of the chip to connection points on the substrate can have disadvantages.

One such known method utilizes wire bonding to connect the active circuit side of the chip to bond pads on the substrate. There can be several disadvantages to using wire bonding to make the electric connection from the FET device to the substrate. Many applications requiring the use of FET devices are high power and high current applications. The FET devices in these applications can drive high current loads, and therefore may require multiple wire bonds to be made to the chip. It is known that in some applications, as many as 10 aluminum wire bonds are needed to handle the current flow. The necessity of multiple wire bonds can result on a negative impact on product costs. In addition, because of the large number of wire bonds per device, it is known that device yield can be as low as 98%. In applications having numerous FET devices, this can have a negative impact on the overall system package yield. These undesirable consequences are often the result of the use of multiple wire bonds.

An additional undesirable consequence stemming from the use of wire bonding results from drain to source resistance ($R_{DS}$). $R_{DS}$ (on) is a key parameter used to size the FET devices for a given application. $R_{DS}$ on often determines how large the device is and hence the cost.

As the number of wire bonds is increased, the amount of silicon area needed to bond out the device is increased, thereby driving the size of the device up. A method of reducing $R_{DS}$ is compared to wire bond technology in addition to increasing die size and reducing cost would be highly desirable. An alternate technology to wire bonding would therefore be preferable.

SUMMARY OF THE INVENTION

It is, therefore, an object of the present invention to provide an integrated circuit assembly with reduced dies, reduced $R_{DS}$, increased current flow capacity and reduced costs. It is a further object of the present invention to provide an integrated circuit assembly with an improved connection between the IC device and the substrate.

In accordance with the objects of the present invention, an integrated circuit assembly is provided. The integrated circuit assembly includes a substrate having a substrate pad and an IC device having an IC pad. The IC device is mounted directly to the substrate. The present invention further includes a conductive bar element having a first and a second end. The first end is soldered to the IC pad and the second bar end is soldered to the substrate pad.

Other objects and features of the present invention will become apparent when viewed in light of the detailed description of the preferred embodiment when taken in conjunction with the attached drawings and appended claims.

BRIEF DESCRIPTION OF THE DRAWINGS

FIG. 1 is a top view illustration of an embodiment of an integrated circuit assembly in accordance with the present invention;

FIG. 2 is a side view of the integrated circuit assembly illustrated in FIG. 1, the side view taken along lines 2—2 in the direction of the arrows;

FIG. 3 is a top view illustration of an embodiment of an integrated circuit assembly in accordance with the present invention; and FIG. 4 is a side vie of the integrated circuit assembly illustrated in FIG. 3, the side view taken along lines 3—3 in the direction of the arrows.

DESCRIPTION OF THE PREFERRED EMBODIMENT(S)

Referring now to FIG. 1, which is top view illustration of an integrated circuit assembly 10 in accordance with the present invention. The integrated circuit assembly 10 includes an integrated circuit device 12 mounted directly onto a substrate 14. The integrated circuit device 12 is preferably in what is known as a "depackaged" state. Although a variety of vertical IC devices 12 are contemplated by the present invention, in one embodiment, the IC device 12 is a field effect transistor (FET). The IC device 12 includes a first contact surface 16 for electrical communication with the substrate 14. Although it is contemplated that a variety of substrate contact surfaces 18 may be utilized by the present invention, in one embodiment the substrate contact surface 18 comprises a substrate solder pad 20 positioned on the substrate 14.

The present invention reduces the undesirable characteristics associated with wire bonding by further including the bar bond element 22 to provide electrical communication between the first contact surface 16 and substrate contact surface 18. The bar bond element 22 is a conductive plate element that provides a reliable single point to point connection from the active side of the IC device 12 to the substrate 14. The lower resistance contact of the bar bond element 22 can result in a lower $R_{DS}$ when compared to prior art wire bonding. The bar bond element can provide heat sinking capabilities to the IC device 12. The bar bond element 22 can act as a heat sink from the top of the IC device 12 to the substrate 14. This can be capitalized on by using a bar bond element 22 with high thermal conductivity. Although it is contemplated that the bar bond element 22 may be comprised of a variety of materials, in one embodiment it is contemplated that the bar bond element 12 is comprised of copper. In another embodiment, it is contemplated the bar bond element can be comprised of Invar. The specific makeup and composition of the bar bond element 22, however, may be modified and/or optimized for specific applications. When used for ceramic substrate applications, for example, it is contemplated that the bar bond element 22 may be comprised of a CTE controlled material. In one preferred ceramic substrate application, it is contemplated that the bar bond element 12 be comprised of a CTE material of which the composite is approximately 6.0 ppm/C. For laminate substrate applications, as another example, it is contemplated that the bar bond element 22 be comprised of a CTE controlled material in the area of the IC device 12 and be comprised of copper elsewhere. It should be understood that although specific compositions and materials have been recited in relationship to the bar bond element 22, a wide variety of materials and specific compositions are contemplated by the present invention.

In addition to the variations in composition, the bar bond element 22 is contemplated to encompass variations in formation as well. One such variation involves the attachment of the bar bond element 22 to the IC device 12 and substrate 14. The bar bond element 22 can be described as a conductive plate element 23 having an IC foot portion 24 and a substrate foot portion 26. (See FIG. 2.) The foot portions 24, 26 provide both the contact surface for communication with the IC device 12 and the substrate 14 as well as the mounting surface for the bar bond element 22. Although a variety of attachment means are contemplated using conductive bonding materials, one embodiment utilizes solder 28 to attach the bar bond element 22 to the IC device 12 and substrate 14 respectively. It is contemplated that the IC foot portion 26 can be arched near the edges of the IC contact surface 16. Solder joint stresses are traditionally highest at the edge of the IC device 12. Since solder joint strain is inversely proportional to the thickness of the solder joint, the arched IC foot portion 24 will allow a thicker solder joint 30 at the edges of the die which results in less stress and longer solder life. Similarly, substrate foot portion 26 can be arched near the edges of the substrate contact surface 18 to allow a thicker solder joint 30 at the edges of the die to further improve solder joint life. It should be understood that the reference to arched foot portions 24, 26 is intended to encompass angled surfaces as well as the illustrated splined surfaces. Furthermore, it is contemplated that the foot portions 24, 26, can be arched/curved near both the inner edge 34 and the outer edge 36 as illustrated on the IC foot portion 24, or they may be arched on only a single edge 40 as illustrated on the substrate foot portion 26.

The present invention can include further improvements to facilitate the soldering of the bar bond element 22 to their respective contact surfaces. It is contemplated that the bar bond element 22 can further comprise at least one solder passageway 42 (such as a punch hole) through the bar bond element 22. The solder passageways 42 are positioned within the IC foot portion 24 and the substrate foot portion 26 to allow excess solder 27 to flow onto the top side surface 44 of the bar bond element 22. By allowing excess solder to flow onto the top side surface 44 of the bar bond element 22, the surface tension of the solder can be utilized to pull the bar bond element 22 down to insure contact with the IC device 12 and the substrate 14.

The bar bond element 22 can further comprise a strain relief loop 46 positioned between the IC foot portion 24 and the substrate foot portion 26. The use of a strain relief loop 46 can increase the compliancy of the bar bone element 22 and allow stress to be absorbed in the bending of the bar bond element 22 rather than in the solder joint. This can provide further stress relief on the solder joints. Strain relief loop 46 can be further improved by including at least one strain relief slot 48 cut into the bar bond element 22. The at least one strain relief slot 48 further improves the bending of the bar bond element 22 and thereby the stress relief to the solder joints.

Finally, the bar bond element 22 can further comprise an integrated gate lead 50 providing communication between an IC gate lead contact 52 and a substrate gate lead contact 54. (See FIG. 3.) The integrated gate lead 50 can be attached to the bar bond element 22 or formed as a portion thereof such that a single structure is attached to the IC device 12 and substrate 14 during the soldering process. The integrated gate lead 50 includes a gate lead portion 56 and a separator portion 58. The separator portion 58 is positioned between the bar bond element 22 and the integrated gate lead 50 such that it can be cut away after the bonding process to result in a separate bar bond element 22 and an independent gate lead 60 (see FIG. 4). In this fashion, manufacturing complexity and cost is reduced. It should be understood, however, that the present invention can be practiced without the presence of an integrated gate lead 50. In alternate embodiments, alternate methods (such as wire bonding) of placing the IC gate lead contact 52 with the substrate gate lead contact 54 can be utilized.

While particular embodiments of the invention have been shown and described, numerous variations and alternative embodiments will occur to those skilled in the art. Accordingly, it is intended that the invention be limited only in terms of the appended claims.

What is claimed is:

1. An integrated circuit assembly comprising:
    a substrate including at least one substrate contact surface;
    an integrated circuit device including at least one first contact surface, said integrated circuit device mounted to said substrate;
    a bar bond element providing communication between said at least one substrate contact surface and said at least one first contact surface, said bar bond element comprising a conductive plate element having an arched integrated circuit foot portion, an arched substrate foot portion, and a strain relief loop positioned between said arched integrated circuit foot portion and said arched substrate foot portion; and
    a first conductive bond positioned between said arched integrated circuit foot portion and said at least one first contact surface, said arched integrated circuit foot portion providing an increase in the thickness of said first conductive bond near an edge of said first contact surface; and
    at least one solder passageway formed through said bar bond element, said at least one solder passageway positioned on said arched integrated circuit foot portion and allowing said first conductive bond to flow onto the topside surface of said bar bond element.

2. An integrated circuit assembly comprising as described in claim 1, further comprising:
    a second conductive bond positioned between said arched substrate foot portion and said at least substrate contact surface, said arched substrate foot portion providing an increase in the thickness of said second conductive bond near an edge of said substrate surface.

3. An integrated circuit assembly as described in claim 2, further comprising:
    at least one solder passageway formed through said bar bond element, said at least one solder passageway positioned on said arched substrate foot portion and allowing said second conductive bond to flow onto the topside surface of said bar bond element.

4. An integrated circuit assembly as described in claim 1, further comprising:
    at least one strain relief slot positioned on said strain relief loop.

5. An integrated circuit assembly as described in claim 1, wherein said integrated circuit device is a field effect transistor.

6. An integrated circuit assembly as described in claim 1, wherein said first conductive bond comprises solder.

7. An integrated circuit assembly as described in claim 1, further comprising:
- an IC gate lead contact formed on said integrated circuit device;
- a substrate gate lead contact formed on said substrate;
- an integrated gate lead formed as a portion of said bar bond element, said integrated gate lead including a gate lead portion and a separator portion, said separator portion removable from said bar bond element, after said bar bond element is bonded to said integrated circuit device, to form an independent gate lead.

8. An integrated circuit assembly as described in claim 1, wherein said bar bond element is comprised of a CTE controlled material.

9. An integrated circuit assembly as described in claim 1, wherein said bar bond element provides heat sink communication between said IC device and said substrate.

10. An integrated circuit assembly comprising:
- a substrate including at least one substrate contact surface;
- an integrated circuit device including at least one first contact surface, said integrated circuit device mounted to said substrate; and
- a bar bond element providing communication between said at least one substrate contact surface and said at least one first contact surface, said bar bond element comprising a conductive plate element having an integrated circuit foot portion, a substrate foot portion, and a strain relief loop positioned between said integrated circuit foot portion and said substrate foot portion; and
- at least one strain relief slot positioned on said strain relief loop.

11. An integrated circuit assembly as described in claim 10, further comprising:
- an IC gate lead contact formed on said integrated circuit device;
- a substrate gate lead contact formed on said substrate;
- an integrated gate lead formed as a portion of said bar bond element, said integrated gate lead including a gate lead portion and a separator portion, said separator portion removable from said bar bond element, after said bar bond element is bonded to said integrated circuit device, to form an independent gate lead.

12. An integrated circuit assembly as described in claim 11, wherein said bar bond element provides heat sink communication between said IC device and said substrate.

13. An integrated circuit assembly as described in claim 10, further comprising:
- a first conductive bond positioned between said integrated circuit foot portion and said at least one first contact surface.

14. An integrated circuit assembly as described in claim 13 further comprising:
- at least one solder passageway formed through said bar bond element, said at least one solder passageway positioned on said integrated circuit foot portion and allowing said first conductive bond to flow onto the topside surface of said bar bond element.

15. An integrated circuit assembly as described in claim 10, further comprising:
- a second conductive bond positioned between said substrate foot portion and said at least one substrate contact surface.

16. An integrated circuit assembly as described in claim 15, further comprising:
- at least one solder passageway formed through said bar bond element, said at least one solder passageway positioned on said substrate foot portion and allowing said second conductive bond to flow onto the topside surface of said bar bond element.

17. An integrated circuit assembly as described in claim 10, wherein said bar bond element is comprised of a CTE controlled material.

18. An integrated circuit assembly comprising:
- a substrate including at least one substrate contact surface;
- an integrated circuit device including at least one first contact surface, said integrated circuit device mounted to said substrate; and
- a bar bond element providing communication between said at least one substrate contact surface and said at least one first contact surface, said bar bond element comprising a conductive plate element having an arched integrated circuit foot portion and an arched substrate foot portion;
- a first conductive bond positioned between said arched integrated circuit foot portion and said at least one first contact surface, said arched integrated circuit foot portion providing an increase in the thickness of said first conductive bond near an edge of said first contact surface;
- a second conductive bond positioned between said arched substrate foot portion and said at least substrate contact surface, said arched substrate foot portion providing an increase in the thickness of said second conductive bond near an edge of said substrate surface; and
- at least one solder passageway formed through said bar bond element, said at least one solder passageway positioned on said arched integrated circuit foot portion and allowing said first conductive bond to flow onto the topside surface of said bar bond element.

19. An integrated circuit assembly comprising:
- a substrate including at least one substrate contact surface;
- an integrated circuit device including at least one first contact surface, said integrated circuit device mounted to said substrate; and
- a bar bond element providing communication between said at least one substrate contact surface and said at least one first contact surface, said bar bond element comprising a conductive plate element having an arched integrated circuit foot portion and an arched substrate foot portion;
- a first conductive bond positioned between said arched integrated circuit foot portion and said at least one first contact surface, said arched integrated circuit foot portion providing an increase in the thickness of said first conductive bond near an edge of said first contact surface;
- a second conductive bond positioned between said arched substrate foot portion and said at least substrate contact surface, said arched substrate foot portion providing an increase in the thickness of said second conductive bond near an edge of said substrate surface;
- a second conductive bond positioned between said arched substrate foot portion and said at least substrate contact surface, said arched substrate foot portion providing an increase in the thickness of said second conductive bond near an edge of said substrate surface; and
- at least one solder passageway formed through said bar bond element, said at least one solder passageway positioned on said arched substrate foot portion and allowing said second conductive bond to flow onto the topside surface of said bar bond element.

* * * * *